United States Patent
Furuhashi et al.

(10) Patent No.: US 6,800,538 B2
(45) Date of Patent: Oct. 5, 2004

(54) SEMICONDUCTOR DEVICE FABRICATION METHOD AND SEMICONDUCTOR FABRICATION CONTROL METHOD

(75) Inventors: Masayuki Furuhashi, Kawasaki (JP); Mitsuaki Hori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/695,650

(22) Filed: Oct. 29, 2003

(65) Prior Publication Data

US 2004/0127068 A1 Jul. 1, 2004

(30) Foreign Application Priority Data

Oct. 30, 2002 (JP) ........................................ 2002-315188

(51) Int. Cl.$^7$ .......................................... H01L 21/336
(52) U.S. Cl. ................... 438/476; 438/758; 438/765; 438/770; 438/786; 438/787; 438/795; 438/471
(58) Field of Search .............................. 438/308.5, 758, 438/765, 770, 786, 787, 795, 471, 476

(56) References Cited

U.S. PATENT DOCUMENTS

| | | | |
|---|---|---|---|
| 5,940,722 A | * | 8/1999 | Tamura ...................... 438/471 |
| 6,004,832 A | * | 12/1999 | Haller et al. .................. 438/50 |
| 6,235,627 B1 | * | 5/2001 | Nakajima .................... 438/638 |
| 2001/0054709 A1 | * | 12/2001 | Heath et al. .................. 257/25 |
| 2003/0017714 A1 | * | 1/2003 | Taniyama et al. ........... 438/758 |
| 2003/0073293 A1 | * | 4/2003 | Ferro et al. .................. 438/478 |

FOREIGN PATENT DOCUMENTS

| | | |
|---|---|---|
| JP | 9-326396 | 12/1997 |
| JP | 10-313012 | 11/1998 |
| JP | 2000-340644 | 12/2000 |
| JP | 2001-102321 | 4/2001 |
| JP | 2001-102386 | 4/2001 |
| JP | 2001-274154 | 10/2001 |

\* cited by examiner

*Primary Examiner*—Matthew Smith
*Assistant Examiner*—Victor V Yevsikov
(74) *Attorney, Agent, or Firm*—Westerman, Hattori, Daniels & Adrian, LLP

(57) ABSTRACT

The method for fabricating a semiconductor device including a step of forming a gate insulation film on a semiconductor substrate 10, the method further comprises, before the step of forming the gate insulation film, the step of forming an insulation film 12, covering a first side (upper side) and a second side (underside) of the semiconductor substrate 10, the step of etching off the insulation film 12 on the first side of the semiconductor substrate 10, and the step of annealing the semiconductor substrate 10 with the insulation film 12 present on the second side of the semiconductor substrate 10. The semiconductor film 12 on the second side of the semiconductor substrate 10 is removed, and the semiconductor substrate 10 is heat-treated with the insulation film 12 present on the second side of the semiconductor substrate 10, whereby even when the annealing is performed at high temperature, the sublimation of semiconductor constituent atoms from the second side of the semiconductor substrate 10 can be prevented. Accordingly, the adhesion of the semiconductor constituent atoms to the temperature sensor, etc. can be prevented, which permits semiconductor devices to be fabricated without complicated maintenance. Thus, semiconductor devices can be fabricated with high fabrication efficiency.

20 Claims, 11 Drawing Sheets

SEMICONDUCTOR DEVICE FABRICATION METHOD AND SEMICONDUCTOR FABRICATION CONTROL METHOD

CROSS-REFERENCE TO RELATED APPLICATION

This application is based upon and claims priority of Japanese Patent Application No.2002-315188, filed on Oct. 30, 2002, the contents being incorporated herein by reference.

BACKGROUND OF THE INVENTION

The present invention relates to a semiconductor device fabrication method and a semiconductor fabrication control method.

Recently, as a pretreatment for forming a gate insulation film, hydrogen annealing, i.e., a heat treatment in an atmosphere containing hydrogen is noted.

The hydrogen annealing is performed for the purposes of causing silicon on the surface of a silicon substrate to migrate to make the surface of the silicon substrate flat and removing natural oxide films formed on the surface of the silicon substrate.

The hydrogen annealing performed as a pretreatment for the step of forming a gate insulation film enables the gate insulation film to be formed in good quality, which makes it possible to fabricate semiconductor devices including transistors of good electric characteristics.

Following references disclose the background art of the present invention.

[Patent Reference 1]

Specification of Japanese Patent Application Unexamined Publication No. 2001-102321

[Patent Reference 2]

Specification of Japanese Patent Application Unexamined Publication No. 2001-274154

[Patent Reference 3]

Specification of Japanese Patent Application Unexamined Publication No. Hei 10-313012

[Patent Reference 4]

Specification of Japanese Patent Application Unexamined Publication No. 2000-340644

[Patent Reference 5]

Specification of Japanese Patent Application Unexamined Publication No. 2001-102386

[Patent Reference 6]

Specification of Japanese Patent Application Unexamined Publication No. Hei 9-326396

However, the hydrogen annealing sublimes silicon from the second side, i.e., the underside of a silicon substrate. In the chamber, a temperature sensor, etc. are disposed below the position where the silicon substrate is mounted. When the silicon sublimes from the second side of the silicon substrate, the silicon which has sublimed adheres to the temperature sensor, etc. The silicon adhering to the temperature sensor lowers the metering accuracy of the temperature sensor, which leads to the decrease of the controllability of the process. In order to ensure the controllability of the process, the semiconductor fabrication system including RTP (Rapid Thermal Process) apparatuses, etc. requires frequent maintenance, which leads to the decrease of the fabrication efficiency.

This disadvantage can take place also in controlling the semiconductor device fabrication process. That is, in controlling the semiconductor device fabrication process, for example, a gate insulation film is formed on a test semiconductor substrate, and the gate insulation film is inspected. When the inspection result is not good, the semiconductor fabrication system, etc. are maintained. In forming a gate insulation film, the same hydrogen annealing as described above is performed as a pretreatment, and in this hydrogen annealing, silicon sublimes from the second side of the silicon substrate.

Here, Patent Reference 1 described above discloses the technique of preventing the sublimation of silicon from the second side of a semiconductor wafer by feeding $O_2$ gas to the second side of the semiconductor wafer to form an oxide film on the second side of the semiconductor wafer when the semiconductor wafer is thermally processed. In the Patent Reference 1 technique, the $O_2$ gas flows up to the first side, i.e., the upper side of the semiconductor wafer to disadvantageously form undesired silicon oxide film on the surface of the semiconductor wafer. The silicon oxide film thus formed on the surface of the semiconductor wafer is unstable in the film thickness, which makes it very difficult to control the gate insulation film in a desired film thickness.

SUMMARY OF THE INVENTION

An object of the present invention is to provide a semiconductor device fabrication method and a semiconductor fabrication control method which, in a heat treatment, can prevent the sublimation of semiconductor constituent atoms from the second side of a semiconductor substrate without the above-described disadvantage.

According to one aspect of the present invention, there is provided a method for fabricating a semiconductor device including the step of forming a gate insulation film on a semiconductor substrate, the method further comprising, before the step of forming the gate insulation film, the steps of: forming an insulation film, covering a first side and a second side of the semiconductor substrate; etching off the insulation film on the first side of the semiconductor substrate; and annealing the semiconductor substrate with the insulation film present on the second side of the semiconductor substrate.

According to another aspect of the present invention, there is provided a method for controlling semiconductor fabrication method including the step of forming a gate insulation film on a test semiconductor substrate and the step of testing the gate insulation film, the method further comprising, before the step of forming the gate insulation film, the steps of: forming an insulation film, covering a first side and a second side of the test semiconductor substrate; etching off the insulation film on the first side of the test semiconductor substrate; and annealing the test semiconductor substrate with the insulation film present on the second side of the test semiconductor substrate.

According to further another aspect of the present invention, there is provided a method for controlling semiconductor fabrication including the step of forming a gate insulation film on a test semiconductor substrate and the step of testing the gate insulation film, the method further comprising, before the step of forming the gate insulation film, the steps of: forming an insulation film on a second side of the test semiconductor substrate; and annealing the test semiconductor substrate with the insulation film present on the second side of the test semiconductor substrate.

According to further another aspect of the present invention, there is provided a method for fabricating a semiconductor device comprising the steps of: forming a second insulation film, covering a first side and a second side of a semiconductor substrate with a first insulation film formed on the second side; forming a semiconductor film, covering the second insulation film on the first side and the second side, etching off the semiconductor film on the second side; and annealing the semiconductor substrate with the second insulation film on the second side of the semiconductor substrate.

According to further another aspect of the present invention, there is provided a method for fabricating a semiconductor device comprising the steps of: forming a first insulation film, covering a first side and a second side of the semiconductor substrate; etching off the first insulation film on the first side of the semiconductor substrate; forming a second insulation film, covering the first side and the second side of the semiconductor substrate; forming a semiconductor film, covering the second insulation film on the first side and the second side; etching off the semiconductor film on the second side; and annealing the semiconductor substrate with the second insulation film present on the second side of the semiconductor substrate.

According to the present invention, a semiconductor film on the second side (underside) of a semiconductor substrate is removed, and the semiconductor substrate is heat treated with the insulation film present on the second side of the semiconductor substrate, whereby even when the heat treatment (annealing) is performed at high temperature, the sublimation of semiconductor constituent atoms from the second side of the semiconductor substrate can be prevented. Accordingly, the adhesion of the semiconductor constituent atoms to the temperature sensor, etc. can be prevented, which permits semiconductor devices to be fabricated without complicated maintenance. Thus, according to the present invention, semiconductor devices can be fabricated with high fabrication efficiency.

According to the present invention, scrub cleaning is performed after the semiconductor film has been removed from the second side of the semiconductor substrate and before the semiconductor substrate is immersed in a cleaning liquid, whereby a considerable number of particles can be removed in the scrub cleaning. Thus, according to the present invention, a number of particles to be mixed in the cleaning liquid can be depressed when the semiconductor substrate is immersed in the cleaning liquid. According to the present invention, a number of particles adhering back to the surface of the semiconductor film, etc. can be made very small, which leads to higher fabrication yields of semiconductor devices.

According to the present invention, the heat treatment is performed with the insulation film present on the second side of the semiconductor substrate, whereby even when the high-temperature heat treatment is performed, semiconductor constituent atoms are prevented from subliming from the second side of the semiconductor substrate. According to the present invention, the adhesion of the semiconductor constituent atoms to the temperature sensor, etc. can be prevented, which permits semiconductor substrates to be fabricated without complicated maintenance. According to the present invention, semiconductor devices can be fabricated with high fabrication efficiency.

According to the present invention, the high temperature heat treatment is performed with the insulation film present on the second side of a test semiconductor substrate, whereby semiconductor constituent atoms are prevented form subliming from the second side of the test semiconductor substrate to thereby adhere to the temperature sensor, etc. Thus, according to the present invention, no complicate maintenance is required, which can improve the inspection efficiency and fabrication efficiency.

DETAILED DESCRIPTION OF THE INVENTION

[A First Embodiment]

Recently, the technique of forming an element isolation region by STI (Shallow Trench Isolation) by patterning a silicon nitride film, using a mask of polysilicon, and etching a silicon substrate with the patterned polysilicon nitride film as a mask to form trenches, i.e., grooves has been proposed. The polysilicon film is formed not only on the first side, i.e., the upper side of the silicon substrate but also on the second side, i.e., the underside of the silicon substrate. When hydrogen annealing is simply performed on such silicon substrate, the silicon sublimes from the polysilicon film on the second side of the silicon substrate and adheres to the temperature sensor, etc. The silicon adhering to the temperature sensor, etc. lowers the metering accuracy of the sensor, which leads to the decrease of the controllability of the process. In order to ensure the controllability of the process, as described above, the semiconductor fabrication system must be frequently maintained, which leads to the decrease of the fabrication efficiency.

The inventors of the present application have made earnest studies and had the idea that the sublimation of silicon from the second side of a silicon substrate can be prevented in the following way.

The semiconductor device fabrication method according to a first embodiment of the present invention will be explained with reference to FIGS. 1A to 7B. FIGS. 1A to 6C are sectional views of a semiconductor device in the steps of the method for fabricating the same according to the present embodiment, which show the method.

Figure 1A:
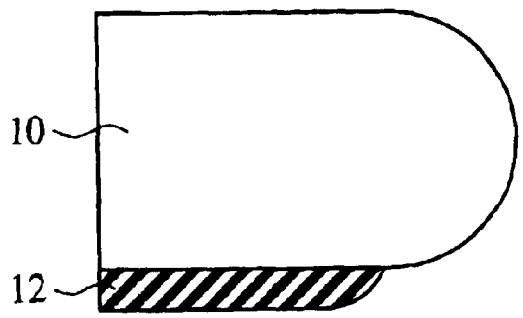
FIGS. 1A to 1C are sectional views of a semiconductor device in the steps of the semiconductor device fabrication method according to a first embodiment of the present invention, which show the method (Part 1).

A silicon substrate 10 with a silicon oxide film 12 formed on the second side, e.g., the underside thereof as shown in FIG. 1A is prepared.

Such substrate is exemplified by, e.g., an epitaxial substrate. The epitaxial substrate is a substrate with a single crystal silicon layer epitaxially grown on the first side, i.e., the upper side of a silicon substrate. Generally, the epitaxial substrate has a silicon oxide film formed on the second side. The epitaxial substrate has the silicon oxide film formed on the second side for the following reason. That is, an impurity, such as boron or others, is doped in the silicon substrate, and when a single crystal silicon layer is simply grown on the silicon substrate, the impurity goes out of the silicon substrate from the second side of the silicon substrate. Then, the impurity is mixed into a film forming atmosphere and into the single crystal silicon layer. In order to form a single crystal silicon layer which does not contain the impurity it is necessary to prohibit the impurity from going out of the silicon substrate from the second side thereof. In order to prohibit the impurity from going out of the silicon substrate from the second side thereof, the silicon oxide film is formed on the second side of the silicon substrate.

On an epitaxial substrate without a silicon oxide film formed on the second side, or on a usual silicon substrate which is not an epitaxial substrate or on an SOI (Silicon On Insulator) substrate, a silicon oxide film 12 is formed on the second side to prepare the silicon substrate 10 in the following way.

Figure 6A:
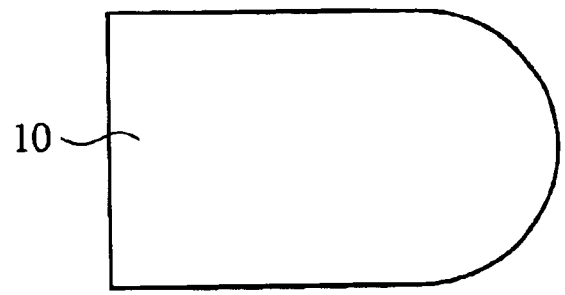
FIGS. 6A to 6C are sectional views of a semiconductor device in the steps of the semiconductor device fabrication method according to the first embodiment of the present invention, which show the method (Part 6).

That is, as shown in FIG. 6A, the silicon substrate 10 is prepared.

Figure 6B:
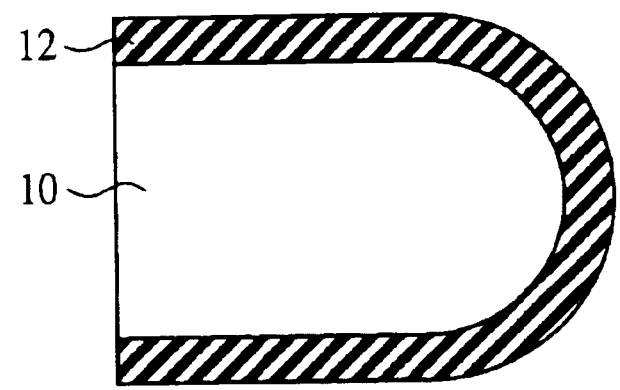
Figure 6C:
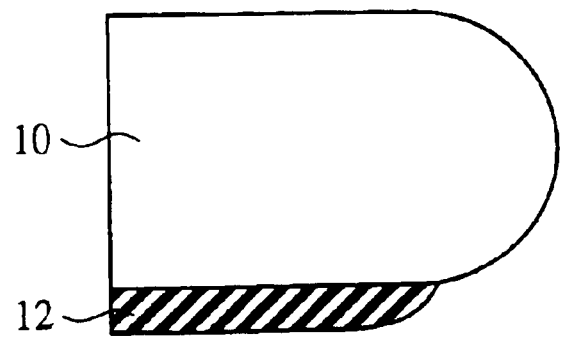

Then, as shown in FIG. 6B, a silicon oxide film 12 is formed by, e.g., thermal oxidation. The silicon oxide film 12 is formed, covering the entire surface of the silicon substrate 10. The thickness of the silicon oxide film 12 is, e.g., about 100 nm.

The silicon oxide film 12 is formed by thermal oxidation but may not be formed essentially by thermal oxidation. The silicon oxide film 12 may be formed by, e.g., CVD or others.

Next, that of the silicon oxide film 12 on the first side, i.e., the upper side of the silicon substrate 10 is removed in the following way. That is, hydrofluoric acid is fed to the first side of the silicon substrate 10 on rotation. At this time, $N_2$ gas is blown onto the second side of the silicon substrate 10 so as to prevent the hydrofluoric acid from flowing down to the second side of the silicon substrate 10. Thus, only the silicon oxide film 12 on the first side of the silicon substrate 10 is removed. Then, the silicon substrate 10 is rinsed with pure water and then dried. Thus, the silicon substrate 10 with the silicon oxide film 12 formed only on the second side thereof is prepared (refer to FIG. 6C).

The silicon substrate 10 with the silicon oxide film 12 formed only on the second side is prepared here by forming the silicon oxide film 12 on the first and the second sides of the silicon substrate 10 and then removing only that of the silicon oxide film 12 on the first side. However, the silicon oxide film 12 may be formed only on the second side of the silicon substrate 10. When the silicon oxide film 12 is formed only on the second side of the silicon substrate 10, CVD, for example, can be used. The film thickness of the silicon oxide film 12 is, e.g., about 10 nm.

Figure 1B:
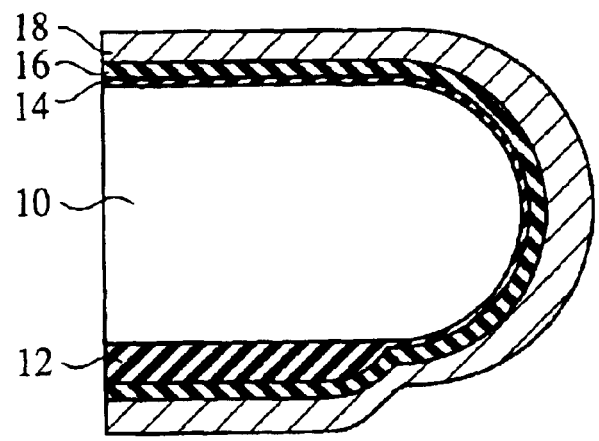
Figure 1C:
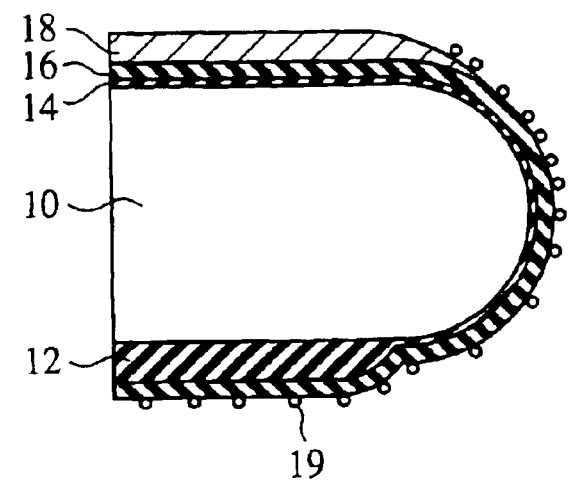

Then, as shown in FIG. 1B, a silicon oxide film 14 is formed on the entire surface of the silicon substrate 10 by, e.g., thermal oxidation. The film thickness of the silicon oxide film 14 is, e.g., about 10 nm. The silicon oxide film 14 functions as a buffer film for mitigating the stress between the silicon nitride film 16 and the silicon substrate 10.

Then, a silicon nitride film 16 is formed by, e.g., CVD. The silicon nitride film 16 is formed, covering the entire surface. The film thickness of the silicon nitride film 16 is, e.g., about 100 nm. The silicon nitride film 16 functions as a stopper film when a silicon oxide film 26 (refer to FIG. 3C) is polished in a later step.

Then, a polysilicon film 18 is formed on the silicon nitride film 16 by, e.g., CVD. The polysilicon film 18 is formed, covering the entire surface. The film thickness of the polysilicon film 18 is, e.g., 150 nm. The polysilicon film 18 functions as a mask for patterning the silicon nitride film 16.

Next, the polysilicon film 18 on the second side of the silicon substrate 10 is removed in the following way. That is, first, the first side and the second side of the silicon substrate 10 is turned over to position the second side of the silicon substrate 10 upper and the second side of the silicon substrate 10 lower. Then, hydrofluoric-nitric acid is fed to the upper side of the silicon substrate 10 on rotation, i.e., the second side thereof. The hydrofluoric-nitric acid is exemplified by hydrofluoric-nitric acid mixing an aqueous solution of 50% concentration hydrofluoric acid and an aqueous solution of 60% concentration nitric acid in 1:50 to 1:300. The blow of the $N_2$ gas onto the underside, i.e., the first side of the silicon substrate 10 prevents the hydrofluoric-nitric acid from flowing to the underside, i.e., the first side of the silicon substrate 10. Thus, the polysilicon film 18 on the second side of the silicon substrate 10 is removed. Then, the silicon substrate 10 is rinsed with pure water and then dried. The silicon substrate 10 has the second side with the silicon nitride film 16 exposed. Particles 19 produced when the polysilicon film 18 was removed adhere to the surface of the exposed silicon nitride film 16.

Figure 2A:
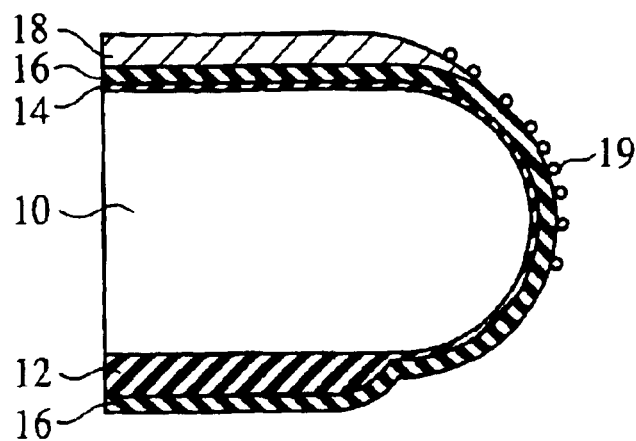
FIGS. 2A to 2C are sectional views of a semiconductor device in the steps of the semiconductor device fabrication method according to the first embodiment of the present invention, which show the method (Part 2).
Figure 2B:
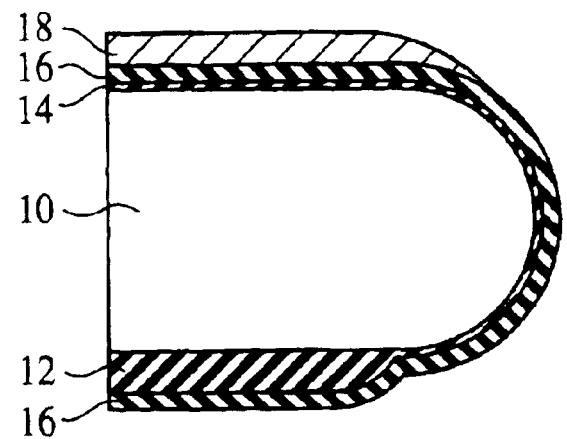

Then, as shown in FIG. 2A, the particles 19 are removed by scrub cleaning. A considerable number of many particles 19 produced when the polysilicon 18 was removed are removed by the scrub cleaning, but all the particles 19 are not removed. Some particles 19 remain on the surface of the silicon substrate 16, etc. The cleaning liquid used in the scrub cleaning can be, e.g., APM (Ammonia-Hydrogen Peroxide Mixture). APM is a cleaning liquid mixing ammonia, hydrogen peroxide and water. The cleaning liquid used in the scrub cleaning is not limited to APM and can be, e.g., pure water. However, APM can remove more particles 19 than pure water.

Then, the silicon substrate 10 is immersed in the cleaning liquid to thereby remove the particles 19 remaining on the surfaces of the silicon nitride film 16, etc. (refer to FIG. 2B).

The cleaning liquid is, e.g., APM. This removes the particles 19 remaining on the surfaces of the silicon nitride film 16. A considerable number of the particles 19 have been already removed by the scrub cleaning, and a number of the particles 19 removed by the immersion of the silicon substrate 10 in the cleaning liquid is not so large. This makes a number of the particles 19 mixed in the cleaning liquid small. A number of the particles 19 mixed in the cleaning liquid is made small, whereby the adhesion of the particles 19 back to the surfaces of the silicon nitride film 16, the polysilicon film 18, etc. can be suppressed.

Next, a photoresist film 20 is formed on the polysilicon film 18 by, e.g., spin coating.

Figure 2C:
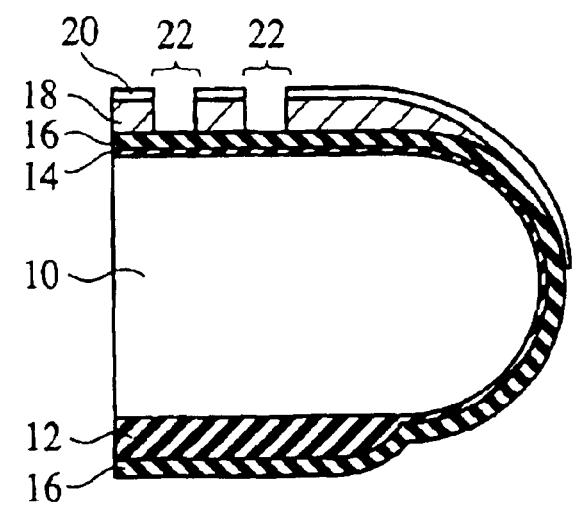

Then, openings 22 are formed in the photoresist film 20 by photolithography (refer to FIG. 2C).

Next, with the photoresist film 20 as a mask, the polysilicon film 18 is anisotropically etched. The etching gas can be a mixed gas of, e.g., HBr and $O_2$.

Figure 3A:
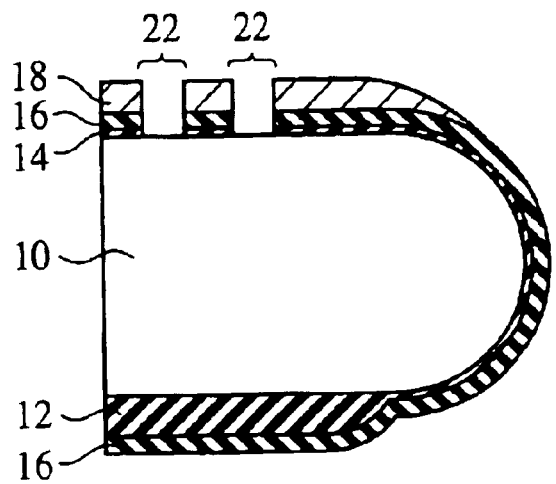
FIGS. 3A to 3C are sectional views of a semiconductor device in the steps of the semiconductor device fabrication method according to the first embodiment of the present invention, which show the method (Part 3).

Then, as shown in FIG. 3A, with the polysilicon film 18 as a mask, the silicon nitride film 16 and the silicon oxide film 14 are anisotropically etched. The etching gas is, e.g., fluorocarbon.

Figure 3B:
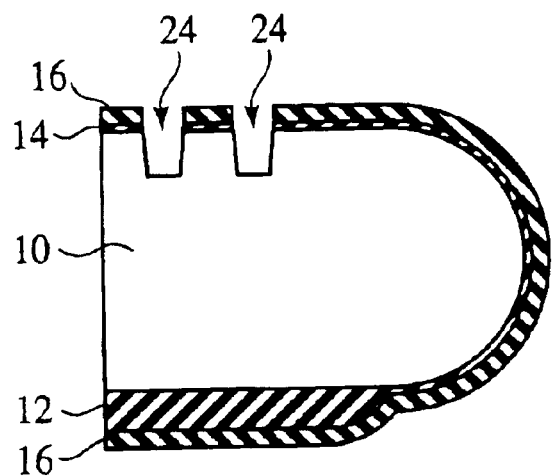

Next, as shown in FIG. 3B, with the silicon nitride film 16 as a mask, the silicon substrate 10 is etched. The etching gas can be, e.g., a mixed gas of HBr and $O_2$. Thus, trenches 24, i.e., grooves are formed in the silicon substrate 10. When the trenches 24 are formed, the polysilicon film 18 on the silicon nitride film 16 is also removed.

Figure 3C:
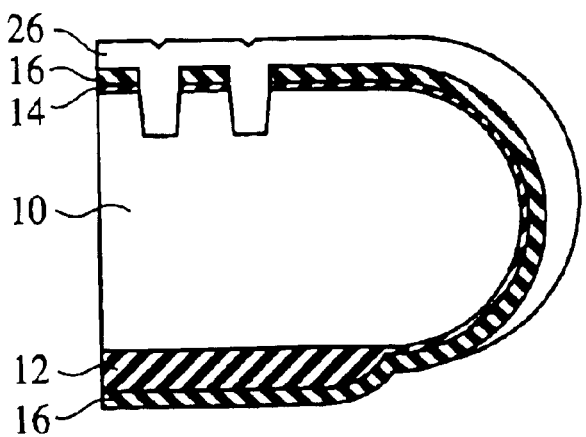

Then, as shown in FIG. 3C, a silicon oxide film 26 is formed by, e.g., HDP (High Density Plasma) CVD. The film thickness of the silicon oxide film 26 is, e.g., 500 nm.

Figure 4A:
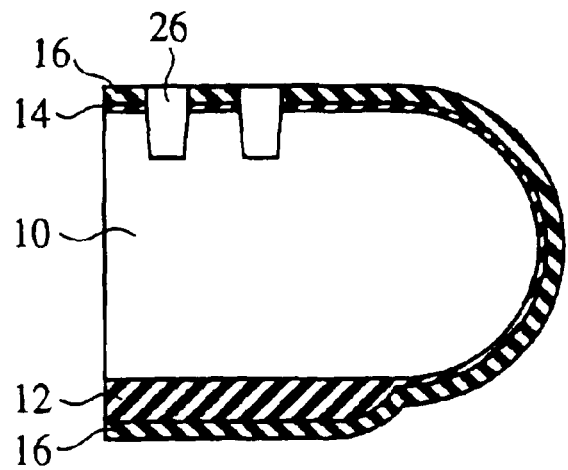
FIGS. 4A to 4C are sectional views of a semiconductor device in the steps of the semiconductor device fabrication method according to the first embodiment of the present invention, which show the method (Part 4).

Next, as shown in FIG. 4A, the silicon oxide film 26 is polished until the surface of the silicon nitride film 16 is exposed. Thus, the silicon oxide film 26 is buried in the trenches 24.

Figure 4B:
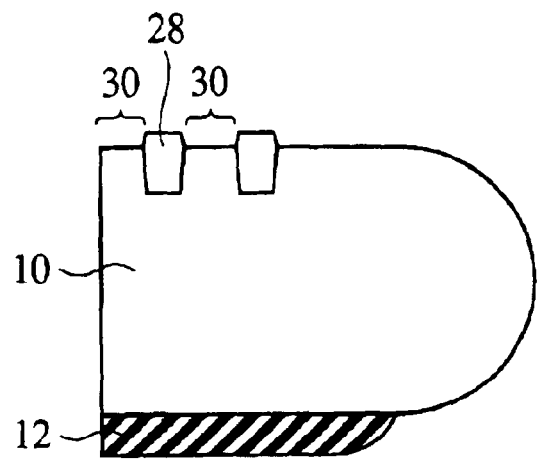

Then, as shown in FIG. 4B, the silicon nitride film 16 is etched off by using, e.g., phosphoric acid.

Next, the silicon oxide film 14 is etched off by using, e.g., hydrofluoric acid. At this time, it is necessary that the silicon oxide film 12 formed on the second side of the silicon substrate 10 and the silicon oxide film 26 buried in the trenches 24 are much etched either. To this end, the silicon oxide film 14 may be etched for a very short period of time. Thus, the element isolation region 28 is formed of the silicon oxide film 26 by STI. The element isolation region 28 defines element regions 30.

Figure 4C:
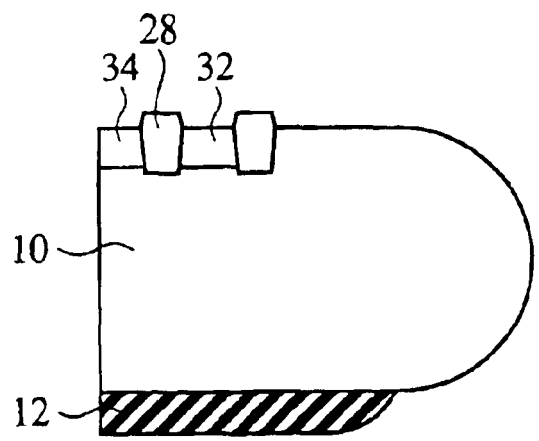

Then, dopant is suitably implanted into the element regions 30 by, e.g., ion implantation to form an n type well 32 and a p type well 34 (refer to FIG. 4C).

Figure 5A:
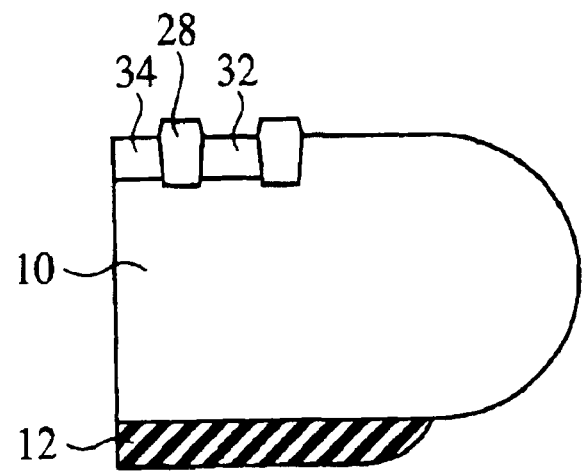
FIGS. 5A and 5B are sectional views of a semiconductor device in the steps of the semiconductor device fabrication method according to the first embodiment of the present invention, which show the method (Part 5).

Next, as shown in FIG. 5A, as a pretreatment for the step of forming a gate insulation film 36 (refer to FIG. 5B), hydrogen annealing, i.e., a heat treatment (annealing) in a hydrogen-content atmosphere is performed. The annealing temperature is, e.g., about 1000° C. When the heat treatment is performed by the hydrogen annealing, the heat treatment is performed with the silicon oxide film 12 remaining on the second side of the silicon substrate 10. The hydrogen annealing with the silicon oxide film 12 remaining on the second side of the silicon substrate 10 can prevent the sublimation of the silicon. The silicon oxide film of a 1 nm- or more thickness on the second side of the silicon substrate 12 can prevent the sublimation of the silicon from the second side of the silicon substrate 10, and the adhesion of the silicon to the temperature sensor, etc. can be prevented.

The hydrogen annealing might reduce a little the surface of the silicon oxide film 12 with the hydrogen and a little thin the thickness of the silicon oxide film 12. The decrease of the thickness of the silicon oxide film 12 depends on the forming process, etc. of the silicon oxide film 12, but the decrease of the thickness is a little as about 1 nm. As long as the silicon oxide film 12 of, e.g., a 2 nm- or more thickness remains on the second side of the silicon substrate 10 at the start of the hydrogen annealing, even when the thickness of the silicon oxide film 12 is decreased by, e.g., 1 nm by the reduction of the silicon oxide film 12 with the hydrogen, the silicon oxide film 12 of a 1 nm or more thickness remains at the end of the hydrogen annealing. The silicon oxide film 12 of a 1 nm or more thickness remaining on the second side of the silicon substrate can sufficiently prevent the sublimation of the silicon from the second side of the silicon substrate 10. In the present embodiment, the silicon oxide film 12 is formed in a sufficient thickness of, e.g., 100 nm, and the silicon oxide film 14 is etched in a short period of etching time so that the silicon oxide film 12 may not be much etched. Accordingly, the silicon oxide film 12 is present on the second side of the silicon substrate 10 in a sufficient thickness. Thus, the sublimation of the silicon from the second side of the silicon substrate 10 can be prevented without failure.

Figure 5B:
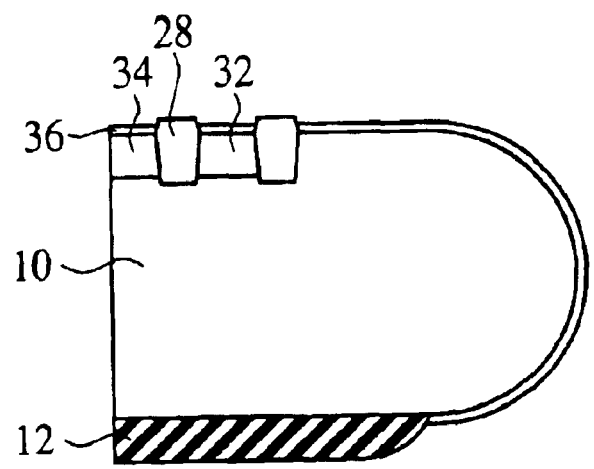

Then, as shown in FIG. 5B, a 1.2 nm-thickness gate insulation film 36 is formed by, e.g., thermal oxidation.

Then, gate electrodes (not shown), a source/drain diffused layer (not shown), etc. are suitably formed.

Thus, the semiconductor device is fabricated by the method according to the present embodiment.

The semiconductor device fabrication method according to the present embodiment is characterized mainly in that the polysilicon film 18 on the second side, i.e., the underside of the silicon substrate 10 is removed, and the thermal processing is performed with the silicon oxide film 12 remaining on the second side of the silicon substrate 10.

When the hydrogen annealing is performed with the polysilicon film 18 remaining on the second side of the silicon substrate 10, as described above, the silicon sublimes from the second side of the silicon substrate 10 and adheres to the temperature sensor, etc. disposed below the position where the silicon substrate 10 is mounted. As described above, the adhesion of silicon to the temperature sensor lowers the metering accuracy of the temperature sensor, which leads to the decrease of the process controllability, and to secure the process controllability, the semiconductor fabrication system requires frequent maintenance, which lowers the fabrication efficiency.

In contrast to this, in the present embodiment, the polysilicon film 18 on the second side of the silicon substrate 10 is removed, and with the silicon oxide film 12 remaining on the second side of the silicon substrate 10, the heat treatment is performed, whereby the sublimation of the silicon from the second side of the silicon substrate 10 can be prevented even when the hydrogen annealing is performed. Thus, according to the present embodiment, the adhesion of the silicon to the temperature sensor, etc. can be prevented, which allows semiconductor devices to be fabricated without frequent maintenance. According to the present embodiment, semiconductor devices can be fabricated with high fabrication efficiency.

As described above, Patent Reference 1 discloses the technique that when a semiconductor wafer is heat-treated, $O_2$ gas is fed to the second side of the semiconductor wafer to form an oxide film on the second side of the semiconductor wafer, whereby the sublimation of the silicon from the second side of the semiconductor wafer is prevented. However, in the Patent Reference 1 technique, the $O_2$ gas flows to the first side of the semiconductor wafer to produce an undesired oxide film on the first side of the semiconductor wafer. The thickness of the oxide film produced on the first side of the semiconductor substrate is not uniform, which makes it very difficult to control the gate insulation film to be formed later to have a desired thickness. In contrast to this, in the semiconductor device fabrication method according to the present embodiment, superiorly to the Patent Reference 1 technique, no undesired silicon oxide film is produced on the first side of the silicon substrate, which allows the gate insulation film to be formed in a desired thickness.

According to the present embodiment, the removal of the polysilicon film 18 on the second side of the silicon substrate 10 can prevent the ends of the polysilicon film 18 from becoming particles.

Figure 7A:
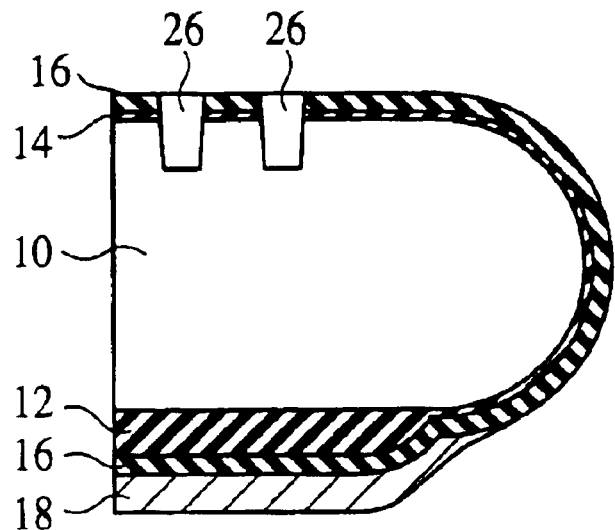
FIGS. 7A and 7B are sectional view of the semiconductor device in the steps of the method for fabricating the same without removing the polysilicon film on the second side of a silicon substrate, which show the method.
Figure 7B:
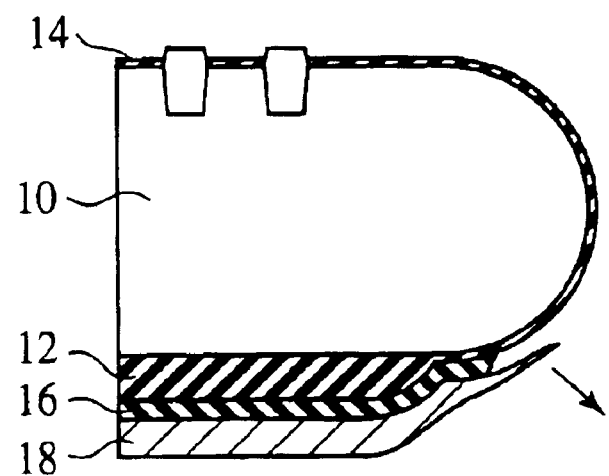

FIGS. 7A and 7B are sectional views of the semiconductor device in the steps of fabricating the semiconductor device without removing the polysilicon film on the second side of the silicon substrate.

When the silicon nitride film 16 is etched off without removing the polysilicon film 18 on the second side of the silicon substrate 10 (refer to FIG. 7A), the end of the polysilicon film 18 is projected beyond the ends of the silicon nitride film 16. In such state, the ends of the polysilicon film 18 are often separated, and the separated ends of the polysilicon film 18 often become particles.

In the present embodiment, the polysilicon film 18 on the second side of the silicon substrate 10 is removed, whereby it does not take place that the ends of the polysilicon film 18 are separated and become particles. Thus, according to the present embodiment, fabrication yields of semiconductor devices can be increased.

The semiconductor device fabrication method according to the present embodiment is also characterized mainly in that after the polysilicon film 18 on the second side of the silicon substrate 10 has been removed, the silicon substrate 10 is scrub-cleaned before the silicon substrate 10 is immersed in a cleaning liquid.

When the silicon substrate 10 is immersed into a cleaning liquid immediately after the polysilicon substrate 18 has been removed, and the particles 19 are removed, a large number of the particles 19 are mixed into the cleaning liquid. The particles 19 mixed in the cleaning liquid often adhere back to the surfaces of the polysilicon film 18, the silicon nitride film 16, etc. There is a tendency that a large number of the particles 19 are mixed in the cleaning liquid, more of the particles 19 adhere back to the surfaces of the polysilicon film 18, the silicon nitride film 16, etc. The adhering-back particles 19 are a factor for lowering the fabrication yields of semiconductor devices.

In contrast to this, in the present embodiment, the silicon substrate 10 is scrub-cleaned after the polysilicon film 18 on the second side of the silicon substrate 10 has been removed and before the silicon substrate 10 is immersed in a cleaning liquid, whereby a considerable number of the particles 19 can be removed by the scrub cleaning. Thus, according to the present embodiment, a number of the particles 19 which are mixed into the cleaning liquid when the silicon substrate 10 is immersed in the cleaning liquid can be small. Accordingly to the present embodiment, a number of the particles 19 which adhere back to the surfaces of the polysilicon film 18, the silicon nitride film 16, etc. can be made very small, which leads to higher fabrication yields of semiconductor devices.

[A Second Embodiment]

The semiconductor device fabrication method according to a second embodiment will be explained with reference to FIGS. 8A to 9C. FIGS. 8A to 9C are sectional views of a semiconductor device in the steps of the method for fabricating the same according to the present embodiment, which show the method. The same members of the present embodiment as those of the semiconductor device fabrication method according to the first embodiment shown in FIGS. 1A to 7B are represented by the same reference numbers not to repeat or to simplify their explanation.

The semiconductor device fabrication method according to the present embodiment is characterized mainly in that the mask of polysilicon film is not formed when the element isolation regions 28 are formed by STI, but the hydrogen annealing is performed with the silicon oxide film 12 present on the second side of the silicon substrate 10.

Figure 8A:
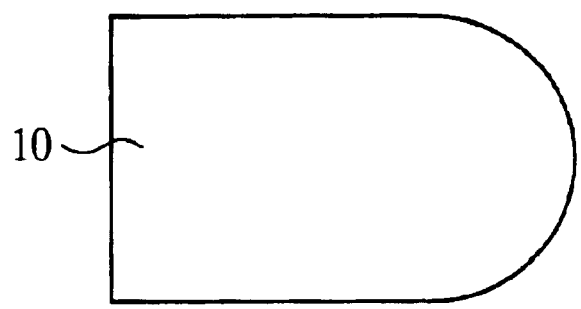
FIGS. 8A to 8C are sectional views of a semiconductor device in the steps of the semiconductor device fabrication method according to a second embodiment of the present invention, which show the method (Part 1).

First, as shown in FIG. 8A, a silicon substrate 10 is prepared. The silicon substrate 10 is a silicon substrate formed by, e.g., CZ method.

Figure 8B:
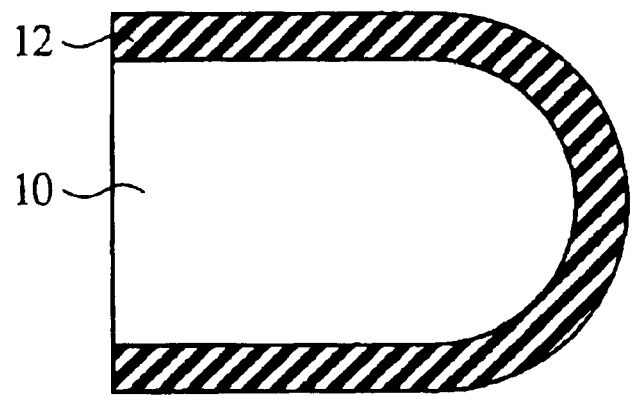
Figure 8C:
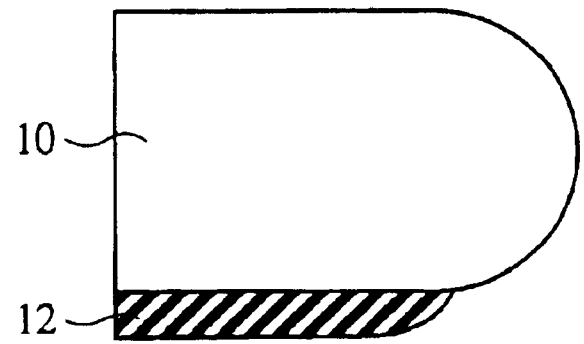

Then, as shown in FIG. 8B, a silicon oxide film 12 is formed on the entire surface of the silicon substrate 12 by, e.g., thermal oxidation. The film thickness of the silicon oxide film 12 is, e.g., about 100 nm.

Next, that of the silicon oxide film 12 on the first side of the silicon substrate 10 is removed by using, e.g., hydrofluoric acid. Thus, the silicon substrate 10 with the silicon oxide film 12 formed on the second side thereof is obtained (refer to FIG. 8C).

The silicon oxide film 12 here is formed on the first side and the second side of the silicon substrate 10, and then that of the silicon oxide film 12 on the first side is removed to thereby prepare the silicon substrate 10 with the silicon oxide film 12 formed only on the second side. However, the silicon oxide film 12 may be formed only on the second side of the silicon substrate 10. When the silicon oxide film 12 is formed only on the second side of the silicon substrate 10, CVD, for example, is used. The thickness of the silicon oxide film 12 is, e.g., about 10 nm.

The silicon substrate 10 is a generally used silicon substrate formed by CZ method but is not essentially a generally used silicon substrate formed by the CZ method and can be, e.g., an SOI substrate.

Figure 9A:
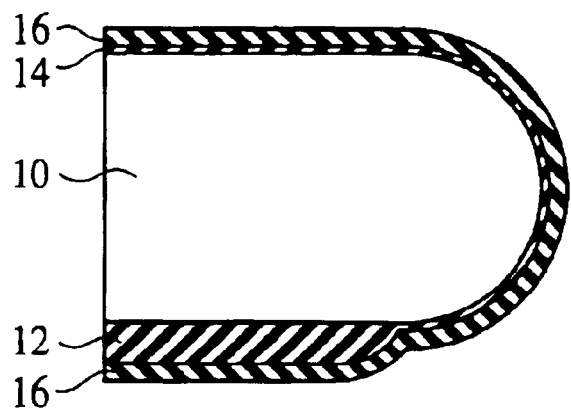
FIGS. 9A to 9C are sectional views of a semiconductor device in the steps of the semiconductor device fabrication method according to the second embodiment of the present invention, which show the method (Part 2).

Next, as shown in FIG. 9A, a silicon oxide film 14 and a silicon nitride film 16 are sequentially formed. The process for forming the silicon oxide film 14 and the silicon nitride film 16 are the same as in, e.g., the semiconductor device fabrication method described above with reference to FIG. 1B.

Figure 9B:
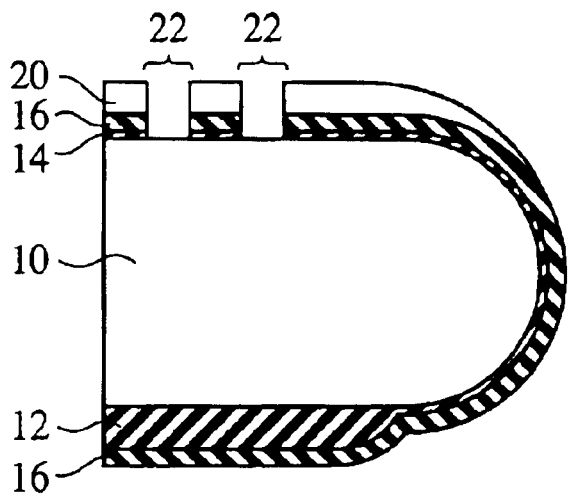

Next, as shown in FIG. 9B, a photoresist film 20 is formed on the silicon nitride film 16 by, e.g., spin coating.

Next, openings 22 are formed in the photoresist film 20 by photolithography.

Next, with the photoresist film 20 as a mask, the silicon nitride film 16 and the silicon oxide film 14 are anisotropically etched. The etching gas is, e.g., fluorocarbon.

Figure 9C:
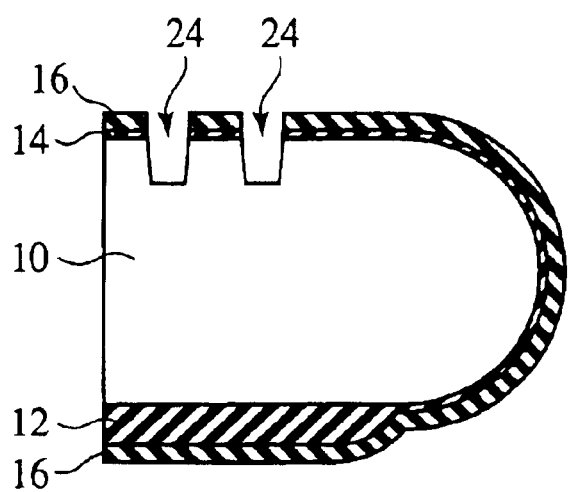

Then, as shown in FIG. 9C, with the silicon nitride film 16 as a mask, the silicon substrate 10 is etched. The etching gas is a mixed gas of, e.g., HBr and $O_2$. Thus, trenches 24 are formed in the silicon substrate 10.

The steps of the semiconductor device fabrication method which follow the above-described steps are the same as those of the semiconductor device fabrication method described above with reference to FIGS. 3C to 5B.

Thus, the semiconductor device is fabricated by the semiconductor device fabrication method according to the present embodiment.

The semiconductor device fabrication method according to the present embodiment is characterized mainly in that, as described above, the mask of the polysilicon film is not formed when the element isolation regions 28 are formed by STI, but the hydrogen annealing is performed with the silicon oxide film 12 formed on the second side of the silicon substrate 10.

According to the present embodiment, the heat treatment is performed with the silicon oxide film 12 present on the second side (underside) of the silicon substrate 10, whereby, as in the first embodiment, the sublimation of the silicon from the second side of the silicon substrate by the hydrogen annealing can be prevented. According to the present embodiment, the adhesion of the silicon to the temperature sensor, etc. can be prevented, which allows the process controllability to be ensured without frequently maintaining semiconductor fabrication systems. Accordingly, semiconductor devices can be fabricated with high fabrication efficiency also by the semiconductor device fabrication method according to the present embodiment.

When an epitaxial substrate, on the second side of which generally silicon oxide film is formed, is used, the sublimation of the silicon from the silicon substrate does not take place when the hydrogen annealing is performed. However, the epitaxial substrate is expensive, and for low costs, it is advantageous to use the generally silicon substrates which are not epitaxial substrates. In the present embodiment, even when a generally used inexpensive silicon substrate is used, the sublimation of the silicon from the second side of the silicon substrate by the hydrogen annealing can be prevented, which contributes further to lower costs.

[A Third Embodiment]

Figure 10A:
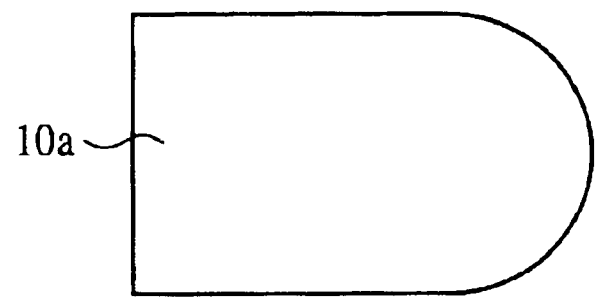
FIGS. 10A to 10C are sectional views of a semiconductor device in the steps of the semiconductor fabrication control method according to a third embodiment of the present invention, which show the method (Part 1).

The semiconductor fabrication control method according to a third embodiment of the present invention will be explained with reference to FIGS. 10A to 11. FIGS. 10A to 11 are sectional views of a semiconductor device in the steps of the method for controlling the semiconductor fabrication according to the present embodiment of the present invention, which show the method The same members of the present embodiment as those of the semiconductor device fabrication method according to the first or the second embodiment of the present invention shown in FIGS. 1A to 9C are represented by the same reference numbers not to repeat or to simplify their explanation.

The semiconductor fabrication control method according to the present embodiment is characterized in that semiconductor fabrication is controlled by the hydrogen annealing is performed with the silicon oxide film 12 present on the second side of a test silicon substrate 10a, then a gate insulation film 36 is formed, and tests are made on the gate insulation film 36, and suitable measures are made in accordance with test results.

First, as shown in FIG. 10A, a test silicon substrate 10a is prepared. The test silicon substrate 10a is a silicon substrate formed by, e.g., CZ method.

Figure 10B:
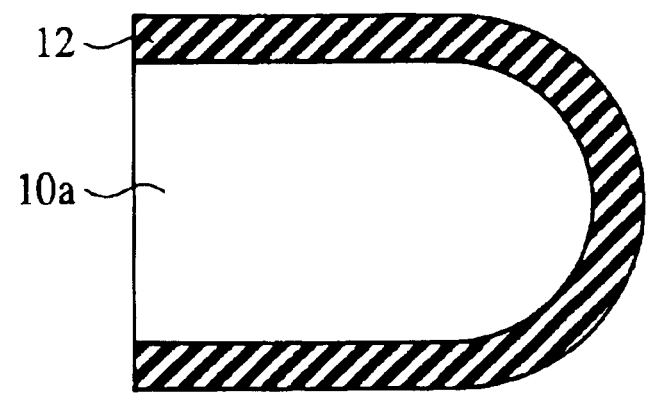
Figure 10C:
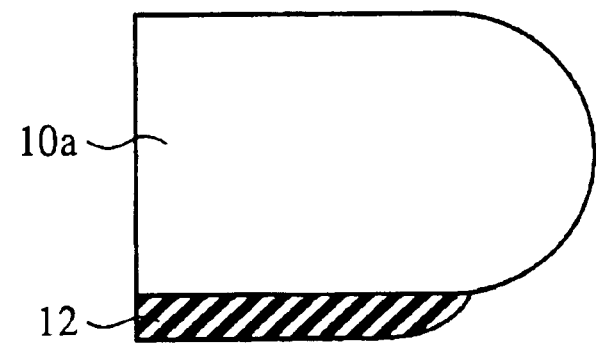
Figure 11:
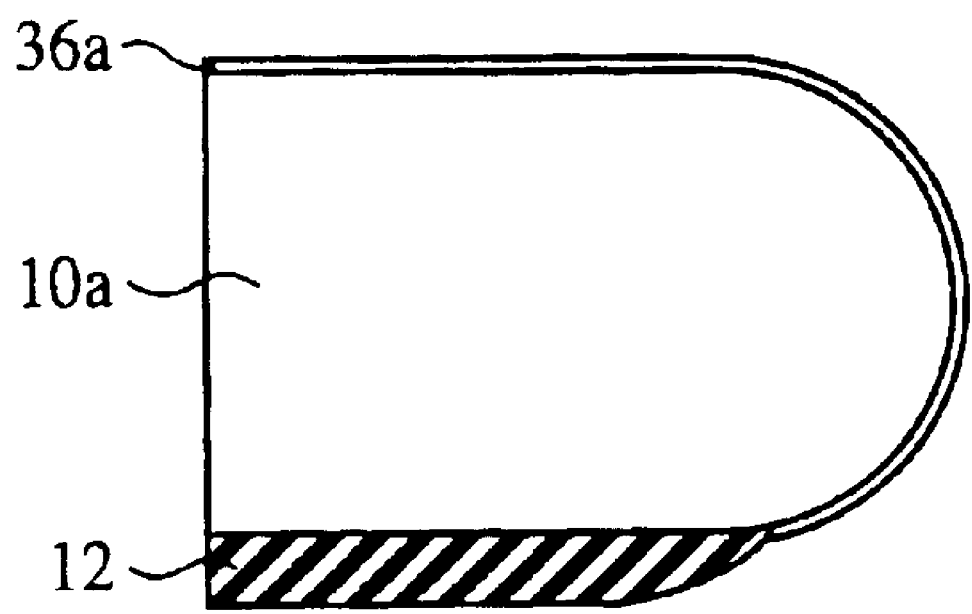
FIG. 11 is a sectional view of a semiconductor device in the steps of the semiconductor fabrication control method according to the third embodiment of the present invention, which shows the method (Part 2).

Then, as shown in FIG. 10B, a silicon oxide film 12 is formed o the entire surface of the test silicon substrate 10a by, e.g., thermal oxidation. The thickness of the silicon oxide film 12 is, e.g., about 100 nm.

Next, that of the silicon oxide film 12 on the first side of the test silicon substrate 10a is removed by using, e.g., hydrofluoric acid. Thus, the test silicon substrate 10a with the silicon oxide film 12 formed only on the second side thereof is prepared (refer to FIG. 10C).

The test silicon substrate 10a with the silicon oxide film 12 formed only on the second side is prepared here by forming the silicon oxide film 12 on the first and the second sides of the test silicon substrate 10a and then removing only that of the silicon oxide film 12 on the first side. However, the silicon oxide film 12 may be formed only on the second side of the test silicon substrate 10a. When the silicon oxide film 12 is formed only on the second side of the test silicon substrate 10a, CVD, for example, can be used. The film thickness of the silicon oxide film 12 is, e.g., about 10 nm.

The test silicon substrate 10a is a generally used silicon substrate formed by CZ method but is not essentially a generally used silicon substrate formed by the CZ method and can be, e.g., an SOI substrate.

Then, as a pretreatment for the step of forming the gate insulation film 36 (refer to FIG. 11), hydrogen annealing is performed. The annealing temperature is, e.g., about 1000° C. The hydrogen annealing is performed with the silicon oxide film 12 present on the second side of the test silicon substrate 10a. By performing the hydrogen annealing with the silicon oxide film 12 present on the second side of the test silicon substrate 10a, as described above, the sublimation of the silicon from the second side of the test silicon substrate 10a can be prevented, and the adhesion of the silicon to the temperature sensor, etc. can be prevented. The silicon oxide film 12 may be present in, e.g., a 1 nm- or more thickness on the second side of the test silicon substrate 10a.

Then, the gate insulation film 36 is formed in a 1.2 nm-thickness by, e.g., thermal oxidation.

Then, tests are made on the gate insulation film 36. The test items are, e.g., the film thickness of the gate insulation film 36.

When the test results of the gate insulation film 36a show that the gate insulation film 36a has been formed, e.g., in a desired thickness, it is judged that the semiconductor fabrication system, etc. have no special problem, and the gate insulation film 36 is formed on a silicon substrate 10 for a semiconductor device to be actually fabricated on (refer to FIG. 5B).

On the other hand, when test results of the gate insulation film 36a show that the gate insulation film 36a has not been formed in, e.g., a desired thickness, it is considered that the semiconductor device fabrication system, etc. have some problems. In such case, suitable measures, such as maintaining the semiconductor device fabrication systems, etc., are made. When the gate insulation film 36a is formed in the desired thickness, the gate insulation film 36 is formed on a silicon substrate 10 for a semiconductor device to be actually fabricated on (refer to FIG. 5A).

The semiconductor fabrication control method according to the present embodiment is characterized mainly in that, as described above, the hydrogen annealing is performed with the silicon oxide film 12 present on the second side of the test silicon substrate 10a, then the gate insulation film 36a is formed, the gate insulation film 36a is inspected, and suitable measures in accordance with test results are taken.

According to the present embodiment, the hydrogen annealing is performed with the silicon oxide film 12 present on the second side (underside) of a test silicon substrate 10a, whereby, as in the above-described embodiment, silicon is prohibited from subliming from the second side of the test silicon substrate 10a to thereby adhere to the temperature sensor, etc. Thus, according to the present embodiment, no complicated maintenance is required, which improve the inspection efficiency and the fabrication efficiency.

When an epitaxial substrate, on the second side of which generally epitaxial film is formed, is used, the sublimation of the silicon from the silicon substrate does not take place when the hydrogen annealing is performed. However, the epitaxial substrate is too expensive for the test substrate. In the present embodiment, even when a generally used inexpensive silicon substrate is used, the sublimation of the silicon from the second side of the silicon substrate by the hydrogen annealing can be prevented, which is very advantageous in comparison with the use of the epitaxial substrate.

[Modified Embodiments]

The present invention is not limited to the above-described embodiments and can cover other various modifications.

For example, in the first embodiment, the mask is the polysilicon film 18, but the material of the mask is not limited to polysilicon. For example, the mask can be amorphous silicon film or others, and any silicon film can be used as the mask. The material of the mask is not limited to silicon and can be any semiconductor. For example, the material of the mask can be a semiconductor having substantially the same etching characteristics as the material of the semiconductor substrate. The use of the material whose etching characteristics are substantially the same of those of the semiconductor substrate permits the mask of a semiconductor formed on the insulation film to be removed concurrently with forming the trenches in the semiconductor substrate with the insulation film as a mask.

In the above-described embodiments, the substrate is a silicon substrate, but the present invention is not limited to the cases using silicon substrates. The present invention is applicable to cases using any semiconductor substrate.

In the above-described embodiments, the silicon oxide film 12 is formed on the second side of the silicon substrates 10, 10a. The insulation films formed on the second side of the silicon substrates 10, 10a are not limited to silicon oxide film. Any film is applicable as long as the film can prevent the sublimation of semiconductor constituent atoms from the second side of the semiconductor substrates.

What is claimed is:

1. A method for fabricating a semiconductor device including the step of forming a gate insulation film on a semiconductor substrate,
    the method further comprising, before the step of forming the gate insulation film, the steps of:
        forming an insulation film, covering a first side and a second side of the semiconductor substrate;
        etching off the insulation film on the first side of the semiconductor substrate; and
        annealing the semiconductor substrate with the insulation film present on the second side of the semiconductor substrate without sublimation of semiconductor constituent atoms of the semiconductor substrate from the second side of the semiconductor substrate.

2. A method for fabricating a semiconductor device according to claim 1, wherein
    in the step of annealing the semiconductor substrate, the semiconductor substrate is heat-treated in a hydrogen-content atmosphere.

3. A method for controlling semiconductor fabrication including a step of forming a gate insulation film on a test semiconductor substrate and a step of testing gate insulation film,
    method further comprising, before the step of forming the gate insulation film, the steps of:
        forming an insulation film, covering a first side and a second side of the test semiconductor substrate;
        etching off the insulation film on the first side of the test semiconductor substrate; and
        annealing the test semiconductor substrate with the insulation film present on the second side of the test semiconductor substrate without sublimation of semiconductor constituent atoms of the test semiconductor substrate from the second side of the test semiconductor substrate.

4. A method for controlling semiconductor fabrication according to claim 3, wherein
    in the step of annealing the test semiconductor substrate, the test semiconductor substrate is heat-treated in a hydrogen-content atmosphere.

5. A method for controlling semiconductor fabrication including a step of forming a gate insulation film on a test semiconductor substrate and a step of testing the gate insulation film,
    the method further comprising, before the step of forming the gate insulation film, the steps of:
        forming an insulation film on a second side of the test semiconductor substrate; and
        annealing the test semiconductor substrate with the insulation film present on the second side of the test semiconductor substrate without sublimation of semiconductor constituent atoms of the test semiconductor substrate from the second side of the test semiconductor substrate.

6. A method for controlling semiconductor fabrication according to claim 5, wherein
    in the step of annealing the test semiconductor substrate, the test semiconductor substrate is heat-treated in a hydrogen-content atmosphere.

7. A method for fabricating a semiconductor device comprising the steps of:
    forming a second insulation film, covering a first side and a second side of a semiconductor substrate with a first insulation film formed on the second side;
    forming a semiconductor film, covering the second insulation film on the first side and the second side,
    etching off the semiconductor film on the second side; and
    annealing the semiconductor substrate with the second insulation film present on the second side of the semiconductor substrate without sublimation of semiconductor constituent atoms of the semiconductor substrate from the second side of the semiconductor substrate.

8. A method for fabricating a semiconductor device according to claim 7, further comprising, after the step of etching off the semiconductor film on the second side and before the step of annealing the semiconductor substrate, the step of immersing the semiconductor substrate in a cleaning liquid.

9. A method for fabricating a semiconductor device according to claim 8, further comprising, after the step of etching off the semiconductor film on the second side and before the step of immersing the semiconductor substrate in the cleaning liquid, the step of scrub-cleaning the second side of the semiconductor substrate.

10. A method for fabricating a semiconductor device according to claim 8, wherein
    in the step of immersing the semiconductor substrate in a cleaning liquid, the semiconductor substrate is immersed in a second cleaning liquid mixing ammonia, hydrogen peroxide and water.

11. A method for fabricating a semiconductor device according to claim 9, wherein
    in the scrub-cleaning step, the second side of the semiconductor substrate is scrub-cleaned by using a first cleaning liquid mixing ammonia, hydrogen peroxide and water, and a brush.

12. A method for fabricating a semiconductor device according to claim 7, further comprising, after the step of removing the semiconductor film from the second side and before the step of annealing the semiconductor substrate, the steps of:

forming an opening down to the second insulation film in the semiconductor film of the first side;

etching the second insulation film with the semiconductor film as a mask;

etching the semiconductor substrate with the second insulation film as a mask to form a trench in the semiconductor substrate; and burying a third insulation film in the trench to form an element isolation region.

13. A method for fabricating a semiconductor device according to claim 12, wherein in the step of annealing the semiconductor substrate, the semiconductor substrate is heat-treated in a hydrogen-content atmosphere, and the method further comprises, after the step of heat treating on the semiconductor substrate, the step of forming a gate insulation film on the semiconductor substrate.

14. A method for fabricating a semiconductor device comprising the steps of:

forming a first insulation film, covering a first side and a second side of the semiconductor substrate;

etching off the first insulation film on the first side of the semiconductor substrate;

forming a second insulation film, covering the first side and the second side of the semiconductor substrate;

forming a semiconductor film, covering the second insulation film on the first side and the second side;

etching off the semiconductor film on the second side; and annealing the semiconductor substrate with the second insulation film present on the second side of the semiconductor substrate without sublimation of semiconductor constituent atoms of the semiconductor substrate from the second side of the semiconductor substrate.

15. A method for fabricating a semiconductor device according to claim 14, further comprising, after the step of etching off the semiconductor film on the second side and before the step of annealing the semiconductor substrate, the step of immersing the semiconductor substrate in a cleaning liquid.

16. A method for fabricating a semiconductor device according to claim 15, further comprising, after the step of etching off the semiconductor film on the second side and before the step of immersing the semiconductor substrate in the cleaning liquid, the step of scrub-cleaning the second side of the semiconductor substrate.

17. A method for fabricating a semiconductor device according to claim 15, wherein in the step of immersing the semiconductor substrate in a cleaning liquid, the semiconductor substrate is immersed in a second cleaning liquid mixing ammonia, hydrogen peroxide and water.

18. A method for fabricating a semiconductor device according to claim 16, wherein in the scrub-cleaning step, the second side of the semiconductor substrate is scrub-cleaned by using a first cleaning liquid mixing ammonia, hydrogen peroxide and water, and a brush.

19. A method for fabricating a semiconductor device according to claim 8, further comprising, after the step of removing the semiconductor film from the second side and before the step of annealing the semiconductor substrate, the steps of:

forming an opening down to the second insulation film in the semiconductor film of the first side;

etching the second insulation film with the semiconductor film as a mask;

etching the semiconductor substrate with the second insulation film as a mask to form a trench in the semiconductor substrate; and burying a third insulation film in the trench to form an element isolation region.

20. A method for fabricating a semiconductor device according to claim 19, wherein in the step of annealing the semiconductor substrate, the semiconductor substrate is heat-treated in a hydrogen-content atmosphere, and the method further comprises, after the step of heat treating on the semiconductor substrate, the step of forming a gate insulation film on the semiconductor substrate.

* * * * *